United States Patent
Hayashi

(10) Patent No.: US 8,133,643 B2
(45) Date of Patent: Mar. 13, 2012

(54) REFLECTIVE MASK BLANK FOR EUV LITHOGRAPHY

(75) Inventor: Kazuyuki Hayashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/070,728

(22) Filed: Mar. 24, 2011

(65) Prior Publication Data

US 2011/0171566 A1 Jul. 14, 2011

Related U.S. Application Data

(63) Continuation of application No. PCT/JP2009/068517, filed on Oct. 28, 2009.

(30) Foreign Application Priority Data

Oct. 30, 2008 (JP) ................................. 2008-279859

(51) Int. Cl.
*G03F 1/00* (2006.01)

(52) U.S. Cl. .......................................................... 430/5

(58) Field of Classification Search .............. 430/5, 394; 428/428, 430; 378/35
See application file for complete search history.

(56) References Cited

U.S. PATENT DOCUMENTS

| | | | |
|---|---|---|---|
| 7,713,666 B2 | 5/2010 | Hayashi et al. | |
| 7,718,324 B2 | 5/2010 | Hayashi et al. | |
| 7,855,036 B2 | 12/2010 | Hayashi et al. | |
| 7,906,259 B2 | 3/2011 | Hayashi et al. | |
| 2006/0251973 A1 | 11/2006 | Takaki et al. | |
| 2010/0035165 A1 | 2/2010 | Hayashi et al. | |
| 2010/0304283 A1 | 12/2010 | Hayashi et al. | |
| 2011/0070534 A1 | 3/2011 | Hayashi | |

FOREIGN PATENT DOCUMENTS

| | | |
|---|---|---|
| JP | 2004-6799 | 1/2004 |
| JP | 2009-21582 | 1/2009 |
| WO | 2007-123263 | 11/2007 |
| WO | 2008/084680 | 7/2008 |
| WO | 2008/093534 | 8/2008 |
| WO | 2009/116348 | 9/2009 |
| WO | 2010/007955 | 1/2010 |

OTHER PUBLICATIONS

U.S. Appl. No. 13/093,968, filed Apr. 26, 2011, Hayashi.
International Search Report issued Feb. 2, 2010 in PCT/JP09/068517 filed Jan. 26, 2010.
U.S. Appl. No. 13/004,081, filed Jan. 11, 2011, Hayashi et al.

*Primary Examiner* — Stephen Rosasco
(74) *Attorney, Agent, or Firm* — Oblon, Spivak, McClelland, Maier & Neustadt, L.L.P.

(57) ABSTRACT

A reflective mask blank for EUV lithography having an absorbing layer which has a low reflectivity with respect to wavelength regions of EUV light and pattern inspection light, and which is easily controllable to obtain desired film composition and film thickness.

The reflective mask blank for EUV lithography having a reflective layer for reflecting EUV light and an absorbing layer for absorbing EUV light which are formed in this order on a substrate, wherein the absorbing layer contains at least tantalum (Ta), boron (B), nitrogen (N) and hydrogen (H), and the absorbing layer has a B content that is 1 at % or greater but less than 5 at %, an H content that is between 0.1 and 5 at %, a Ta+N total content that is between 90 and 98.9%, and a Ta:N composition ratio (Ta:N) that is between 8:1 and 1:1.

37 Claims, 1 Drawing Sheet

REFLECTIVE MASK BLANK FOR EUV LITHOGRAPHY

TECHNICAL FIELD

The present invention relates to a reflective mask blank for EUV (extreme ultraviolet) lithography used for producing a semiconductor or the like (in this description, it is referred to as "EUV mask blank").

BACKGROUND ART

In the semiconductor industry, a photolithography method using visible light or ultraviolet light has been employed as a technique of transcribing a fine pattern on a Si substrate or the like, which is required for forming an integrated circuit having such fine pattern. However, the microsizing of semiconductor devices has been accelerated, and on the other hand, the conventional photolithography method approaches the limit. In the photolithography method, it is said that the resolution limit for a pattern is about ½ of exposure wavelength and is about ¼ of exposure wavelength even if an immersion method is used. Even though the immersion method with an ArF laser (193 nm) is used, it is estimated that the limit is about 45 nm. From this point of view, EUV lithography which is an exposure technique using EUV light having a further shorter wavelength than ArF laser has been considered to be promising as an exposure technique for 45 nm or below. In this description, the EUV light indicates a ray having a wavelength in a soft X-ray region or a vacuum ultraviolet ray region, specifically, a ray having a wavelength of about 10 to 20 nm, particularly about 13.5 nm±0.3 nm.

The EUV light is apt to be absorbed by any substance and the refractive indices of the substance with respect to this wavelength is close to 1, and therefore, the conventional dioptric system such as the photolithography using visible light or ultraviolet light cannot be employed. For this reason, a catoptric system, i.e. a reflective photomask and a mirror are employed in the EUV light lithography.

A mask blank is a laminated member before patterning which is used for producing a photomask. The EUV mask blank has a reflective layer for reflecting EUV light and an absorbing layer for absorbing EUV light which are formed in this order on a substrate such as glass or the like. For the reflective layer, normally used is a multilayered reflective film which is formed by laminating alternately a layer of high refractive index and a layer of low refractive index whereby the reflectance of light is increased when EUV light is irradiated to the layer surface. As the absorbing layer, a material having a high absorbing coefficient to EUV light, specifically, a material having Cr or Ta as major component, is used.

Patent Document 1 describes that a tantalum-boron alloy nitride (TaBN), a tantalum-boron alloy oxide (TaBO) and a tantalum-boron alloy oxynitride (TaBNO) is preferably usable as the material for the absorbing layer since they have a high absorbing coefficient to EUV light and a low reflectance of deep ultraviolet light having a wavelength region (190 nm to 260 nm) of pattern inspection light.

Patent Document 1 describes that the crystalline structure of the absorbing layer is preferably amorphous in order that the surface of the absorbing layer has an excellent smoothness, and in order that the crystalline structure of a TaBN film, TaBO film or TaBNO is amorphous, the B content in this film is preferably between 5 and 25 at % (atomic percentage, the same expression is used in the description). Patent Document 2 describes TaBSiN as an example of the material for the absorbing layer.

PRIOR ART DOCUMENTS

Patent Documents

Patent Document 1: JP-A-2004-6799 (U.S. Pat. No. 7,390,596)
Patent Document 2: WO2007/123263 (US2009-11341)

DISCLOSURE OF INVENTION

Technical Problem

In the case of using the TaBO film or the TaBNO film for the absorbing layer, however, when the O content of the film is increased, the insulation property of the absorbing layer increases whereby a charge-up takes place when electron-beam-writing is conducted to the absorbing layer, and therefore it is not preferable.

On the other hand, when the absorbing layer is formed of the TaBN film, there is no risk of occurrence of charge-up in the electron-beam-writing.

When the TaBN film is used for the absorbing layer, the film is formed by using a magnetron sputtering method or the like which is a method for minimizing occurrence of defect. In this case, it is possible to form the TaBN film by using, for example, a Ta target and a B target, and by causing simultaneously electric discharges of these targets in a nitrogen atmosphere. It is also possible to form the TaBN film by using a target of TaB compound, and by causing an electric discharge of this target in a nitrogen atmosphere.

However, in the technique of using, for example, the Ta target and the B target, B has a high resistance and is a light element, and therefore, the film deposition rate of the B target is often 1/10 or lest in comparison with the Ta target. Accordingly, in order to add a B content (5 at % or greater) which is necessary to make the crystalline structure of the film to be amorphous, as described in Patent Document 1, the film deposition rate of the Ta target must be lowered. However, it is undesirable because the productivity decreases remarkably.

On the other hand, in a technique using the TaB compound target, when the target comprising a compound containing, for example, 20 at % of B and 80 at % of Ta is used, the maximum content of B added actually in the film is about 6 at %, so that it is difficult to control the B content in the film to be 5 at % or greater. Further, when N is added, the B content in the film is 4 at % or less, so that it is difficult to make the crystalline structure of the film to be amorphous.

In order to solve this problem, it is expected to increase the B content in the film by increasing further the B content in the TaB compound target (for example, 50 at % of B and 50 at % of Ta). However, as the B content in the TaB target increases, the resistance of the TaB target becomes greater whereby the electric discharge becomes unstable and the film deposition rate becomes low. When the electric discharge is unstable, there may cause variability in the film composition or the film thickness and sometimes it may be impossible to form the film.

The present invention is to solve the problem of the conventional technique and to provide an EUV mask blank having excellent characteristics, in particular, to provide an EUV mask blank having an absorbing layer which has a low reflectivity with respect to wavelength regions of EUV light and a pattern inspection light and which is easily controllable to obtain desired film composition and film thickness.

Solution to Problem

The inventors of this invention have studied to solve the above-mentioned problem, and have found that when a TaBNH film containing at least tantalum (Ta), boron (B), nitrogen (N) and hydrogen (H) is used as the film composition, but not TaBN film, the film structure of the film becomes amorphous even though the B content of the film is less than 5 at % whereby an absorbing layer having excellent etching characteristics and optical characteristics, thereby permitting a stable production.

The present invention has been made based on the above-mentioned finding, and is to provide a reflective mask blank for EUV lithography having a reflective layer for reflecting EUV light and an absorbing layer for absorbing EUV light which are formed in this order on a substrate, the reflective mask blank for EUV lithography being characterized in that the absorbing layer contains at least tantalum (Ta), boron (B), nitrogen (N) and hydrogen (H), and the absorbing layer has a B content that is 1 at % or greater but less than 5 at %, an H content that is between 0.1 and 5 at %, a Ta+N total content that is between 90 and 98.9 at %, and a Ta:N composition ratio (Ta:N) that is between 8:1 and 1:1.

In this description, the composition ratio means the atomic ratio.

The present invention is to provide a reflective mask blank for EUV lithography having a reflective layer for reflecting EUV light and an absorbing layer for absorbing EUV light which are formed in this order on a substrate, the reflective mask blank for EUV lithography being characterized in that the absorbing layer contains at least tantalum (Ta), boron (B), nitrogen (N) and hydrogen (H), and the absorbing layer is, in its crystalline state, amorphous.

In the EUV mask blank of the present invention, it is preferred that the surface roughness of the absorbing layer is 0.5 nm rms or less.

In the EUV mask blank of the present invention, it is preferred that the film thickness of the absorbing layer is between 30 and 100 nm.

In the EUV mask blank of the present invention, it is preferred that a low reflective layer with respect to inspection light which is used for inspecting a mask pattern, is formed on the absorbing layer, the low reflective layer contains at least tantalum (Ta), boron (B), oxygen (O) and hydrogen (H), and the low reflective layer has a B content that is 1 at % or greater but less than 5 at %, an H content that is between 0.1 and 15 at %, a Ta+O total content that is between 80 and 98.9 at %, and a Ta:O composition ratio (Ta:O) that is between 1:8 and 3:1.

In the EUV mask blank of the present invention, it is preferred that a low reflective layer with respect to inspection light which is used for inspecting a mask pattern, is formed on the absorbing layer, the low reflective layer contains at least tantalum (Ta), boron (B), oxygen (O), nitrogen (N) and hydrogen (H), and the low reflective layer has a B content that is 1 at % or greater but less than 5 at %, an H content that is between 0.1 and 15 at %, a Ta+O+N total content that is between 80 and 98.9 at % and a Ta:O+N composition ratio (Ta:(O+N)) that is between 1:8 and 3:1.

The present invention is to provide a reflective mask blank for EUV lithography having a reflective layer for reflecting EUV light, an absorbing layer for absorbing EUV light and a low reflective layer with respect to inspection light which is used for inspecting a mask pattern, which are formed in this order on a substrate the reflective mask blank for lithography being characterized in that, the low reflective layer contains at least tantalum (Ta), boron (B), oxygen (O) and hydrogen (H), and the low reflective layer (TaBOH) has a B content that is 1 at % or greater but less than 5 at %, an H content that is between 0.1 and 15 at %, a Ta+O total content that is between 80 and 98.9 at %, and a Ta:O composition ratio (Ta:O) that is between 1:8 and 3:1.

The present invention is to provide a reflective mask blank for EUV lithography having a reflective layer for reflecting EUV light, an absorbing layer for absorbing EUV light and a low reflective layer with respect to inspection light which is used for inspecting a mask pattern, which are formed in this order on a substrate, the reflective mask blank for lithography being characterized in that the low reflective layer contains at least tantalum (Ta), boron (B), oxygen (O), nitrogen (N) and hydrogen (H), and the low reflective layer (TaBONH) has a B content that is 1 at % or greater but less than 5 at %, an H content that is between 0.1 and 15 at %, a Ta+O+N total content that is between 80 and 98.9 at % and a Ta:O+N composition ratio (Ta:(O+N)) that is between 1:8 and 3:1.

It is preferred that when a low reflective layer is formed on the absorbing layer, the surface roughness of the low reflective layer is 0.5 nm rms or less.

It is preferred that when a low reflective layer is formed on the absorbing layer, the film thickness of the low reflective layer is between 5 and 30 nm.

In the EUV mask blank of the present invention, it is preferred that a protection layer for protecting the reflective layer at the time of forming a pattern in the absorbing layer, is formed between the reflective layer and the absorbing layer, and with respect to the wavelength of the light used for inspecting the pattern formed in the absorbing layer, the contrast of the reflection light at the surface of the protection layer with the reflection light at the surface of the low reflective layer, is 30% or greater.

It is preferred that the H concentration of the low reflective layer is at least 1.5 at % higher than the H concentration of the absorbing layer.

It is preferred that when a low reflective layer is formed on the absorbing layer, the reflectivity at the surface of the low reflective layer is 15% or less with respect to the wavelength of the light used for inspecting a pattern formed in the absorbing layer.

In the EUV mask blank of the present invention, it is preferred that the absorbing layer is formed by sputtering a TaB compound target in the atmosphere containing nitrogen (N), hydrogen (H) and an inert gas containing at least one of helium (He), argon (Ar), neon (Ne), krypton (Kr) and xenon (Xe).

It is preferred that the TaB compound target is composed of Ta=80 to 99 at % and B=1 to 20 at %.

When the low reflective layer (TaBOH) is formed on the absorbing layer, it is preferred that the low reflective layer is formed by sputtering a TaB compound target in the atmosphere containing oxygen (O), hydrogen (H) and an inert gas containing at least one of helium (He), argon (Ar), neon (Ne), krypton (Kr) and xenon (Xe).

The TaB compound target is preferably composed of Ta=80 to 99 at % and B=1 to 20 at %.

When the low reflective layer (TaBONH) is formed on the absorbing layer, it is preferred that the low reflective layer is formed by sputtering a TaB compound target in the atmosphere containing oxygen (O), nitrogen (N), hydrogen (H) and an inert gas containing at least one of helium (He), argon (Ar), neon (Ne), krypton (Kr) and xenon (Xe).

It is preferred that the TaB compound target is composed of Ta=80 to 99 at % and B=1 to 20 at %.

Further, the present invention is to provide a reflective mask for EUV lithography characterized by conducting patterning to the absorbing layer and the low reflective layer of the reflective mask blank for EUV lithography of the present invention.

Further, the present invention is to provide a method for producing a semiconductor integrated circuit characterized in that the semiconductor integrated circuit is produced by exposing light to an object to be exposed with use of the reflective mask for EUV lithography of the present invention.

Advantageous Effects of Invention

The EUV mask blank of the present invention has an absorbing layer containing a low B content (of less than 5 at %). Accordingly, when the absorbing layer is formed, there is little risk of a problem caused by a reduction of the film deposition rate or an unstable electric discharge at the time of forming the films, specifically, a problem of variability in the film composition or film thickness, or incapability of film formation.

In the EUV mask blank of the present invention, since the crystalline structure of the absorbing layer is amorphous, the absorbing layer surface has an excellent smoothness.

The absorbing layer has excellent characteristics for the EUV mask blank such as a low reflectivity of EUV light and a low reflectivity with respect to the wavelength region of pattern inspection light.

In the EUV mask blank of the present invention, when a low reflective layer is formed on the absorbing layer, it is possible to lower the reflectivity in the wavelength region of the pattern inspection light. Accordingly, in a pattern inspection which is carried out after a pattern has been formed in the mask blank, an excellent contrast is obtainable.

In the EUV mask blank of the present invention, when the absorbing layer and the low reflective layer are formed by a sputtering method, a TaB compound target having a specified composition is used, whereby an unstable electric discharge or variability in the film composition or film thickness can be avoided.

DESCRIPTION OF EMBODIMENTS

In the following, the EUV mask blank of the present invention will be described with reference to drawings.

Figure 1:
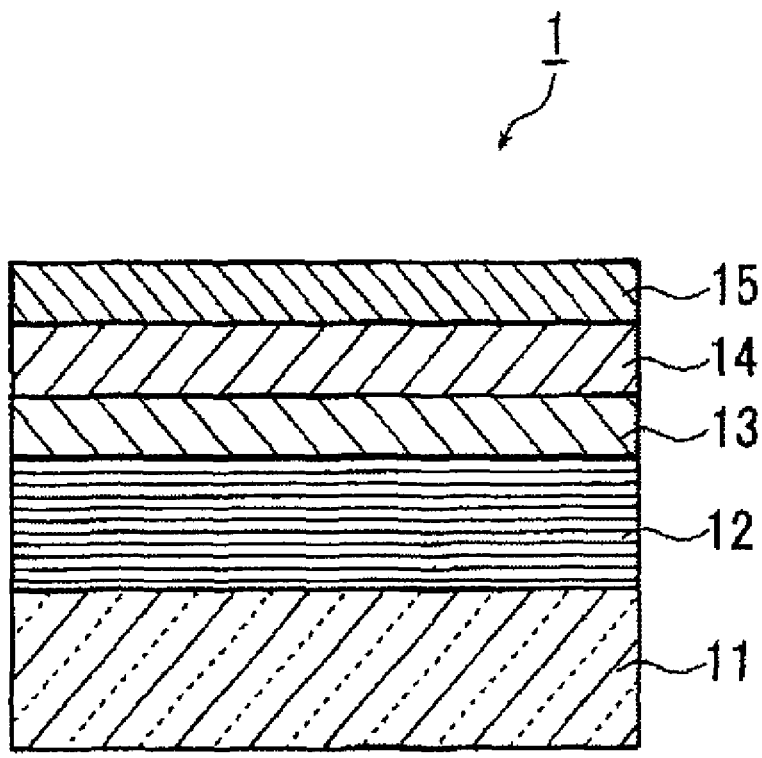
FIG. 1 is a cross-sectional view showing schematically a first embodiment of the EUV mask blank of the present invention.

FIG. 1 is a cross-sectional view showing schematically a first embodiment of the EUV mask blank of the present invention. In the mask blank 1 shown in FIG. 1, a reflective layer 12 for reflecting EUV light and an absorbing layer 14 for absorbing EUV light are formed in this order on a substrate 11.

Between the reflective layer 12 and the absorbing layer 14, a protection layer 13 for protecting the reflective layer 12 at the time of forming a pattern in the absorbing layer 14, is formed. On the absorbing layer 14, a low reflective layer 15 with respect to inspection light used for inspecting a mask pattern is formed. It is noted however that in the EUV mask blank 1 of the present invention, the substrate 11, the reflective layer 12 and the absorbing layer 14 are essential in the structure shown in FIG. 1, and the protection layer 13 and the low reflective layer 15 are optional structural elements.

Description will be made as to individual structural elements of the mask blank 1.

The substrate 11 is required to satisfy the characteristics that the substrate of EUV mask blank should possess. Accordingly, the substrate 11 has preferably a low thermal expansion coefficient ($0\pm1.0\times10^{-7}/°$ C., more preferably $0\pm0.3\times10^{-7}/°$ C., much more preferably $0\pm0.2\times10^{-7}/°$ C., further preferably $0\pm0.1\times10^{-7}/°$ C., especially preferably $0\pm0.05\times10^{-7}/°$ C.), and be excellent in smoothness, flatness and durability to a cleaning liquid used for cleaning the mask blank or the photomask after the formation of a pattern. The substrate 11 can be glass having a low thermal expansion coefficient, specifically, $SiO_2$—$TiO_2$ glass. However, it is not limited to such glass, but a substrate of crystallized glass with a β quartz solid solution precipitated, quartz glass, silicon, metal or the like may be employed.

From viewpoints of a cleaning effect of carbon contamination and a deoxization effect of an oxidized film, such glass has preferably a hydrogen molecule concentration of $1\times10^{16}$ molecules/cm$^3$, $5\times10^{16}$ molecules/cm$^3$, $1\times10^{17}$ molecules/cm$^3$, $5\times10^{17}$ molecules/cm$^3$ or greater. It is more preferable that the hydrogen molecule concentration is $1\times10^{18}$ molecules/cm$^3$ or greater, further preferably $5\times10^{18}$ molecules/cm$^3$ or greater, particularly preferably $1\times10^{19}$ molecules/cm$^3$ or greater. In order to maintain such effect for a longer period, it is preferred to be $5\times10^{19}$ molecules/cm$^3$ or greater.

The measurement of the hydrogen molecule concentration is preferably conducted as described below with use of a thermal desorption spectrometer (TDS) manufactured by ESCO, Ltd. as stated in the specification of Patent JP3298974. A sample of glass into which hydrogen molecules are introduced is put in the thermal desorption spectrometer, the interior of the measuring chamber is vacuumed to $5\times10^{-7}$ Pa or lower and then the sample of glass is heated. The mass number of gas thus generated is measured with a mass spectrometer placed inside TDS. In the desorption profile of hydrogen molecules, peaks are observed in a region of around 200 to 800° C. wherein the maximum value appears at around 420° C. Further, in the desorption profile of water molecule, the peaks observed in the region of around 100 to 200° C. wherein the maximum value appears at around 150° C. are considered that water adsorbed physically on the glass surface is desorbed.

Then, a sample of glass without introducing hydrogen molecule is put in the thermal desorption spectrometer and the interior of the measuring chamber is vacuumed to $5\times10^{-7}$ Pa or lower, and then the sample is heated to measure the mass number of gas generated. The observed peaks are considered to be owing to the desorption of water adsorbed physically at around 100 to 200° C. On the other hand, a peak having the maximum value at around 420° C. was not observed.

From this, it can be considered that the peaks observed at around 200 to 800° C. wherein the maximum value appears at around 420° C. is owing to the desorption of hydrogen molecules introduced in the glass. Accordingly, the number of hydrogen molecules separated from the measured sample can be calculated from the integrated strength ratio of desorption peaks of hydrogen molecules of the measured sample and a standard sample in which the hydrogen concentration is already known.

In a case of using hydrogen-ion-injected silicon as a standard sample for example, the following measuring method is employed. Silicon (manufactured by ESCO, Ltd.) in which $1 \times 10^{16}$ hydrogen ions were injected was placed in the thermal desorption spectrometer, the interior of the measuring chamber was vacuumed to $5 \times 10^{-7}$ Pa or lower, and then the sample is heated. Desorption peaks were observed at around 350 to 750° C. wherein the maximum appeared at around 550° C. These peaks take place at the time of the desorption of $1 \times 10^{16}$ hydrogen ions in the silicon.

It is preferred that the substrate 11 has a smooth surface of 0.15 nm rms or less and a flatness of 100 nm or less because the photomask after the formation of a pattern provides a high reflectivity and an accurate transcription.

The size or the thickness of the substrate 11 is determined appropriately depending on designed values of the mask and so on. In an example described later, a $SiO_2$—$TiO_2$ glass of 6 inches (152.4 mm) square in outer contour and of 0.25 inches (6.3 mm) thick is employed.

It is preferred that no defect exists in the surface of substrate 11 on which the reflective layer 12 is formed. Even in the case that a defect exists, the depth of a defect having a recess and the height of a defect having a projection should be 2 nm or less and the half width values of theses defect of recess and the defect of projection are preferably 60 nm or less so as not to cause a topological defect due to the defect of recess and/or the defect of projection.

The reflective layer 12 is not in particular limited as long as it has predetermined characteristics as the reflective layer for the EUV mask blank. Here, the reflective layer 12 is particularly required to have a high reflectivity of EUV ray. Specifically, when a ray in the wavelength region of EUV light is irradiated to the surface of the reflective layer 12, the maximum value of the reflectivity to the ray having a wavelength of around 13.5 nm is preferably 60% or more, more preferably 65% or more. Even in a case of providing the protection layer 13 or the low reflective layer 15 on the reflective layer 12, it is preferable that the maximum value of the reflectivity of the ray having a wavelength of around 13.5 nm is 60% or more, more preferably 65% or more.

The reflective layer 12 can achieve a high reflectivity to EUV ray, and accordingly, a multilayered reflective film formed by laminating alternately a layer of high refractive index and a layer of low refractive index plural times is generally employed as the reflective layer 12. In this multilayered reflective film forming the reflective layer 12, Mo is widely employed for the layer of high refractive index and Si is widely employed for the layer of low refractive index. Namely, a Mo/Si multilayered reflective film is most common. However, the multilayered reflective film is not limited thereto, but a Ru/Si multilayered reflective film, a Mo/Be multilayered reflective film, a Mo compound/Si compound multilayered reflective film, a Si/Mo/Ru multilayered reflective film, a Si/Mo/Ru/Mo multilayered reflective film or a Si/Ru/Mo/Ru multilayered reflective film may be employed.

The film thickness of each layer constituting the multilayered reflective film for the reflective layer 12 and the number of the repeating unit of the layers are properly determined depending on materials of the films used and the EUV ray reflectivity required for this reflective layer. Taking the Mo/Si reflective film as an example, and in order to form a reflective layer 12 wherein the maximum value of the EUV ray reflectivity is at least 60%, the multilayered reflective film can be formed by laminating a Mo layer having a film thickness of 2.3±0.1 nm and a Si layer having a film thickness 4.5±0.1 nm so as to have a repeating unit of 30 to 60.

Each of the layers constituting the multilayered reflective film for the reflective layer 12 is formed to have a desired thickness by using a known film deposition method such as magnetron sputtering method, ion beam sputtering method or the like. For example, when a Si/Mo multilayered reflective film is formed by using an ion beam sputtering method, a Si target is used as the target and an Ar gas (a gas pressure of $1.3 \times 10^{-2}$ Pa to $2.7 \times 10^{-2}$ Pa) is used as sputtering gas, and a Si film is formed to have a thickness of 4.5 nm under an ion acceleration voltage of 300 to 1,500 V and a film deposition rate of 0.03 to 0.30 nm/sec, and then, a Mo target is used as the target and an Ar gas (a gas pressure of $1.3 \times 10^{-2}$ Pa to $2.7 \times 10^{-2}$ Pa) is used as sputtering gas to deposit preferably a Mo film having a thickness of 2.3 nm under an ion acceleration voltage of 300 to 1,500 V and a film deposition rate of 0.03 to 0.30 nm/sec. By taking the above-mentioned operation as one cycle, the Si film and the Mo film are laminated in a cycle of 40 to 50 thereby to obtain a Si/Mo multilayered reflective film.

It is preferred that in order to prevent the surface of the reflective layer 12 from being oxidized, the uppermost layer of the multilayered reflective film for the reflective layer 12 should be the layer of a material hardly oxidized. The layer of a material hardly oxidized functions as a cap layer for the reflective layer 12. As a concrete example of the layer of a material hardly oxidized which functions as the cap layer, there is a Si layer. When the multilayered reflective film for the reflective layer 12 is a Si/Mo film, its uppermost layer be a Si layer, so that the uppermost layer can function as the cap layer. In this case, the film thickness of the cap layer is preferably 11.0±1.0 nm.

The protection layer 13 is provided for the purpose as follows. When a pattern is formed in the absorbing layer 14 by an etching process, normally by a dry etching process, the reflective layer 12 may suffer a damage by the etching process. Accordingly, the protection layer 13 is to protect the reflective layer 12. Therefore, the material which hardly suffers influence of the etching process to the absorbing layer 14 is selected for the protection layer 13, namely, such a material that the etching rate to the protection layer is lower than that of the absorbing layer 14 and that hardly suffers a damage by the etching process, is selected. The material satisfying this condition may be Cr, Al and Ta, a nitride thereof, Ru, a Ru compound (RuB, RuSi etc.), $SiO_2$, $Si_3N_4$, $Al_2O_3$ and a mixture thereof. Among these, it is preferred to use Ru, a Ru compound (RuB, RuSi etc.), and at least one of CrN and $SiO_2$, it is particularly preferred to use Ru or a Ru compound (RuB, RuSi etc.).

The thickness of the protection layer 13 is preferably 1 to 60 nm. Further, the protection layer may be constituted by a single layer or plural layers.

The protection layer 13 is formed by using a known deposition method such as a magnetron sputtering method or an ion beam sputtering method. When a Ru film is deposited by the magnetron sputtering method, it is preferred that the film is deposited so as to have a thickness of 2 to 5 nm, by using a Ru target as the target, using an Ar gas (a gas pressure of $1.0 \times 10^{-1}$ Pa to $10 \times 10^{-1}$ Pa) as the sputtering gas, applying a power of 30 to 500 W and setting the film deposition rate to be 5 to 50 nm/min.

As the characteristics required particularly to the absorbing layer 14, it should have an extremely low EUV ray reflectivity. Specifically, it is preferred that the maximum reflectivity of ray having a wavelength of around 13.5 nm is 0.5% or lower, more preferably, 0.1% or lower when a ray in the wavelength region of EUV light is irradiated onto the surface of the absorbing layer 14.

In order to achieve the above-mentioned characteristics, it is preferred to employ a material having a high EUV light absorbing coefficient.

The absorbing layer 14 for the EUV mask blank 1 of the present invention can achieve the above-mentioned characteristics when it contains tantalum (Ta), boron (B), nitrogen (N) and hydrogen (H) at the specified ratio as described below.

The B content of the absorbing layer 14 is 1 at % or greater but less than 5 at %. In the conventional technique, when a film containing Ta and B (such as TaB film, TaBN film, TaBO film, TaBNO film) is employed for the absorbing layer, it was necessary that the B content be 5 at % or greater so that the crystalline state of the film be amorphous. As having described about the conventional technique, however, there was such problem that when the B content was 5 at % or greater, the deposition rate became low and it was difficult to control the B content and the film thickness of the film.

In the EUV mask blank 1 of the present invention, the absorbing layer 14 contains Ta, B, N and H at a specified ratio whereby the crystalline state of the absorbing layer 14 is amorphous even when the B content of the absorbing layer 14 is less than 5 at %. When the B content of the absorbing layer 14 is less than 1 at %, H should be added much more so that the crystalline state of the absorbing layer 14 is rendered to be amorphous. Specifically, the H content be preferably greater than 5 at %, however, there is a demand that the EUV ray reflectivity be 0.5% or less. To meet this requirement, the film thickness of the absorbing layer becomes thicker, this is undesirable. When the B content of the absorbing layer 14 is 5 at % or greater, there may take place a problem of low film deposition rate or the like, as described above.

It is more preferred that the B content of the absorbing layer 14 be between 1 and 4.5 at %, and is much more preferably to be between 1.5 and 4 at %. The range of 1.5 to 4 at % is very preferable because a stable film deposition is obtainable, the layer has an excellent smoothness which is a characteristic required for the mask and such range provides a good balance of these characteristics.

The H content of the absorbing layer 14 is between 0.1 and 5 at %. If the H content of the absorbing layer 14 is less than 0.1 at %, it is difficult that the crystalline state of the absorbing layer 14 is amorphous. H is a material having a low absorbing coefficient to EUV light. Accordingly, when the H content of the absorbing layer 14 is greater than 5 at %, the film thickness of the absorbing layer may be too large to control the EUV ray reflectivity to be 0.5% or lower.

It is preferred that the H content of the absorbing layer 14 is between 0.1 and 4.5 at %, more preferably between 0.5 and 4.5 at %, further preferably between 1 and 4 at %.

In the absorbing layer 14, the remainder excluding B and H is preferably Ta and N. Specifically, the Ta+N total content in the absorbing layer 14 is between 90 and 98.9 at %. More preferably, the Ta+N total content in the absorbing layer 14 is between 91 and 98.9 at %, much more preferably between 91.5 and 98 at %.

The composition ratio (Ta:N) of Ta and N in the absorbing layer 14 is between 8:1 and 1:1. When the proportion of Ta is higher than the composition ratio, it is impossible to lower sufficiently the ray reflectivity in the wavelength region of a pattern inspection light. On the other hand, the proportion of N is higher than the composition ratio, the film density decreases and the absorbing coefficient of EUV light decreases whereby a sufficient absorption characteristic of EUV light is not obtainable. Further, the oxidation resistance of the absorbing layer 14 decreases. It is preferred that the composition ratio (Ta:N) of Ta and N in the absorbing layer 14 is between 5:1 and 1:1, particularly between 3:1 and 1:1.

Further, it is more preferred that the Ta content of the absorbing layer 14 is between 50 and 90 at %, much more preferably between 55 and 80 at %, particularly preferably between 60 and 80 at %. It is preferred that the N content of the absorbing layer 14 is between 5 and 30 at %, much more preferably between 10 and 25 at %.

The absorbing layer 14 may contain an element other than Ta, B, N and H, however, it is important that the layer satisfies the property of the mask blank, such as EUV ray absorbing characteristics and so on.

In order to achieve a low reflection characteristic, the absorbing layer contains preferably a Cr content of 3 at % or less, particularly 1 at % or less, or it rather contains no Cr. Further, in order to achieve a low reflection characteristic, the absorbing layer contains preferably a Ti content of 3 at % or lower, particularly 1 at % or lower, or it rather contains no Ti.

It is preferred that the absorbing layer 14 with the above-mentioned structure is amorphous in its crystalline state. In this description, "the crystalline state is amorphous" includes a microcrystalline structure in addition to an amorphous structure which does not have the crystalline structure at all. When the absorbing layer 14 is made of a film of amorphous structure or a film of microcrystalline structure, the surface of the absorbing layer 14 has excellent smoothness.

In the EUV mask blank 1 of the present invention, the absorbing layer 14 is formed of a film of amorphous structure or a film of microcrystalline structure, and accordingly, the surface roughness of the absorbing layer 14 is 0.5 nm rms or less. If the surface roughness of the absorbing layer 14 is larger, the edge roughness of a pattern formed in the absorbing layer 14 is large whereby the dimensional accuracy of the pattern decreases. As the pattern is finer, the influence of the edge roughness is remarkable, and accordingly, it is preferred that the surface of the absorbing layer 14 is smooth.

When the surface roughness of the absorbing layer 14 is 0.5 nm rms or less, the surface of the absorbing layer 14 is sufficiently smooth, so that there is no trouble of the deterioration of dimensional accuracy of a pattern due to the edge roughness. The surface roughness of the absorbing layer 14 is more preferably 0.4 nm rms or less, much more preferably 0.3 nm rms or less.

The fact that the crystalline state of the absorbing layer 14 is amorphous, namely, when it has an amorphous structure or a microcrystalline structure, it can be verified by an X-ray diffraction (XRD) method. When the crystalline state of the absorbing layer 14 is amorphous or a microcrystalline structure, diffraction peaks obtained by the XRD measurement do not have sharpness.

It is preferred that the thickness of the absorbing layer 14 is between 30 and 100 nm. The absorbing layer 14 having the above-mentioned structure can be formed by using a sputtering method such as a magnetron sputtering method or an ion beam sputtering method, which are known deposition methods. When the magnetron sputtering method is employed, the absorbing layer 14 can be formed by the method of the below-mentioned (1) or (2).

(1) A absorbing layer 14 is formed by using a Ta target and a B target and by causing simultaneous electric discharge of these targets in the atmosphere containing nitrogen (N), hydrogen (H) and an inert gas containing at least one of helium (He), argon (Ar), neon (Ne), krypton (Kr) and xenon (Xe).

(2) An absorbing layer 14 is formed by using a TaB compound target and by causing the electric discharge of it in the atmosphere containing nitrogen (N), hydrogen (H) and an inert gas containing at least one of helium (He), argon (Ar), neon (Ne), krypton (Kr) and xenon (Xe).

In these methods, the method according to (2) is preferred from the viewpoint that an unstable electric discharge and variability in film composition and film thickness can be avoided. The TaB compound target whose composition is Ta=80 to 99 at % and B=1 to 20 at % is particularly preferable from the viewpoint that an unstable electric discharge and variability in the film composition and the film thickness can be avoided.

In order to form the absorbing layer 14 according to the method described above as an example, the film can be formed under the conditions described specifically as follows.

Method Using a TaB Compound Target (2)

Sputtering gas: A gas mixture of Ar, $N_2$ and $H_2$ ($H_2$ gas concentration of 1 to 50 vol %, preferably 1 to 30 vol %; $N_2$ gas concentration of 1 to 80 vol %, preferably 5 to 75 vol %; Ar gas concentration of 5 to 95 vol %, preferably 10 to 94 vol %; gas pressure of $1.0 \times 10^{-1}$ Pa to $50 \times 10^{-1}$ Pa, preferably $1.0 \times 10^{-1}$ Pa to $40 \times 10^{-1}$ Pa, much more preferably $1.0 \times 10^{-1}$ Pa to $30 \times 10^{-1}$ Pa).

Applied power: 30 to 1,000 W, preferably 50 to 750 W, more preferably 80 to 500 W Film deposition rate: 0.5 to 60 nm/min, preferably 1.0 to 45 nm/min, more preferably 1.5 to 30 nm/min When an inert gas other than argon is used, the concentration of the inert gas should be in the same range as such Ar gas concentration. When an inert gas composed of a plurality of kind is used, the total concentration of the inert gas should be in the same range as such Ar gas concentration.

The low reflective layer 15 is made of a film which effects a low reflection with respect to inspection light used for inspecting a mask pattern. In the production of an EUV mask, after a pattern was formed in the absorbing layer, an inspection is conducted whether or not this pattern has been correctly formed according to a predetermined design. In the inspection of the mask pattern, an inspecting device using a light of about 257 nm is usually employed, as inspection light. Namely, it detects the difference of reflectivity with respect to the light having a wavelength of about 257 nm. Specifically, the inspection is conducted to find the difference of reflectivity between the surface which appears after the absorbing layer 14 has been removed by forming a pattern and the surface of the absorbing layer 14 remained without being removed by the pattern formation. Here, the former indicates the surface of the reflective layer 12 or the surface of the protection layer 13 which is usually utilized. Accordingly, in a case of small difference of reflectivity between the surface of the protection layer 13 and the surface of the absorbing layer 14 with respect to the wavelength of the inspection light, the contrast in the inspection is not good and a correct inspection result is not obtainable.

The absorbing layer 14 having the above-mentioned structure has an extremely low EUV ray reflectivity and excellent characteristics as an absorbing layer for the EUV mask blank 1. However, when inspection light having a certain wavelength is used, the ray reflectivity cannot always be sufficiently low. As a result, there is a case that the difference between the reflectivity at the surface of the absorbing layer 14 and the reflectivity at the surface of the protection layer 13 with respect to the wavelength of inspection light is small whereby there is a possibility that a sufficient contrast is not obtainable in the inspection. When a sufficient contrast can not be obtained in the inspection, a defect of a pattern in the mask cannot sufficiently be discriminated, so that a correct defect-finding inspection cannot be carried out.

In the EUV mask blank 1 of the present invention, a good contrast is obtainable in the inspection because the low reflective layer 15 with respect to inspection light is formed on the absorbing layer 14. In other words, the ray reflectivity in the wavelength of inspection light can remarkably be lowered. Specifically, it is preferred that when a ray in the wavelength region of inspection light is irradiated to the surface of the low reflective layer 15, the maximum ray reflectivity in the wavelength of the inspection light is 15% or less, more preferably 10% or less, further preferably 5% or less.

When the ray reflectivity in the wavelength of the inspection light on the low reflective layer 15 is 15% or less, the contrast in the inspection is good. Specifically, the contrast between the reflection light in the wavelength of the inspection light at the surface of the protection layer 13 and the reflection light in the wavelength of the inspection light at the surface of the low reflective layer 15 is 40% or greater.

Figure 2:
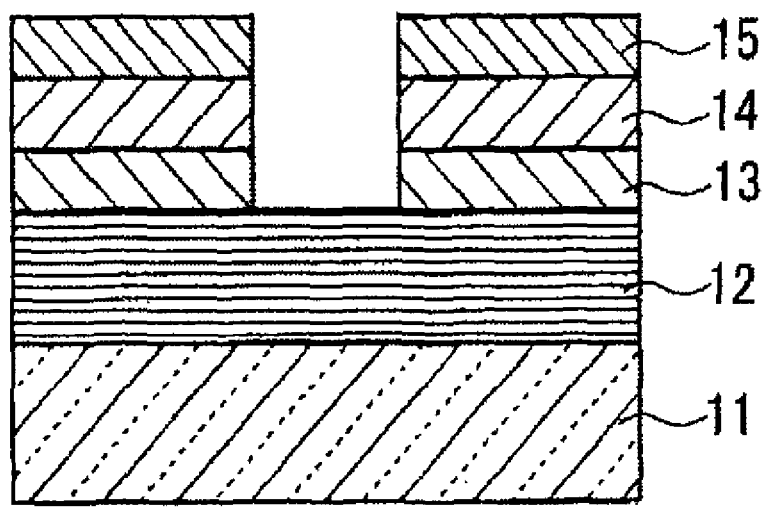
FIG. 2 shows a state that a pattern is formed in the absorbing layer 14 (and the low reflective layer 15) of the EUV mask blank 1 shown in FIG. 1.

In this description, the contrast is obtainable by using the following formula:

$$\text{Contrast (\%)} = ((R_2 - R_1)/(R_2 + R_1)) \times 100$$

Wherein $R_2$ represents the reflectivity at the surface of the protection layer 13 with respect to the wavelength of the inspection light and $R_1$ represents the reflectivity at the surface of the low reflective layer 15. These $R_1$ and $R_2$ are measured, as shown in FIG. 2, in a state that a pattern is formed in the absorbing layer 14 (and the low reflective layer 15) of the EUV mask blank 1 shown in FIG. 1. The above-mentioned $R_2$ is a value measured at the surface of the reflective layer 12 or the surface of the protection layer 13 which is exposed in the air as a result that the absorbing layer 14 and the low reflective layer 15 are removed by the formation of a pattern, and the $R_1$ is a value measured at the surface of the low reflective layer 15 which remains without being removed by the pattern formation.

In the present invention, the contrast represented in the above formula is preferably 45% or more, more preferably 60% or more, particularly preferably 80% or more.

In order to achieve the above-mentioned characteristics, it is preferred that the low reflective layer 15 is made of a material that the refractive index in the wavelength of inspection light is lower than that of the absorbing layer 14 and that its crystalline state is amorphous.

In a first embodiment of the low reflective layer 15 of the EUV mask blank 1 of the present invention, the above-mentioned characteristics can be obtained by incorporating Ta, B, O and H at the specified ratio described hereinbelow, The B content of the low reflective layer 15 is 1 at % or greater but less than 5 at %.

As described already on the absorbing layer, when a film containing Ta and B (such as TaB film, TaBN film, TaBO film, TaBNO film) was employed, it was necessary that the B content of the film be 5 at % or greater in order that the crystalline state of the film was amorphous. In the EUV mask blank 1 of the present invention, the low reflective layer 15 containing Ta, B, O and H at a specified ratio is amorphous in its crystalline state even when the B content of the low reflective layer 15 is less than 5 at %, therefore it is preferable. Further, the absorbing layer may be oxidized by conducting an oxygen plasma treatment to use it as a low reflective layer.

When the B content of the low reflective layer 15 is less than 1 at %, it is necessary to increase a dosage of H so that the crystalline state of the low reflective layer 15 is amorphous.

Specifically, the H content should be greater than 15 at %. This measure, however, may increase the total film thickness of absorbing layer 14 and low reflective layer 15 which is necessary to control the EUV ray reflectivity to be 0.5% or less, which depends also on the H content and the film thickness of the absorbing layer 14, therefore it is undesirable. When the B content of the low reflective layer 15 is 5 at % or greater, it may take place the same problem as described on the absorbing layer 14, such as the problem of low film deposition rate.

The B content of the low reflective layer 15 is preferably 1 to 4.5 at %, more preferably 1.5 to 4 at %.

The H content of the low reflective layer 15 is between 0.1 and 15 at %. When the H content of the low reflective layer 15 is less than 0.1 at %, the crystalline state of the low reflective layer 15 becomes hardly amorphous. Since H is a material having a low absorbing coefficient of EUV light, when the H content of the low reflective layer 15 is greater than 15 at %, the total film thickness of absorbing layer 14 and low reflective layer 15 which is necessary to control the EUV ray reflectivity to be 0.5% or less, which depends also on the H content and the film thickness of the absorbing layer 14, may be large, therefore, it is undesirable.

The H concentration of the low reflective layer 15 is preferably from 0.5 to 10 at %, and more preferably 1 to 10 at %, 3 to 10 at %, or about 5 to 9 at %.

It is preferred that the H concentration of the low reflective layer 15 is at least 1.5 at %, more preferably at least 2.5 at % higher, particularly about 3.5 to 8 at % higher than the H concentration of the absorbing layer 14.

It is preferred that the remainder excluding B and H in the low reflective layer 15 is Ta and O, Specifically, the total content of Ta and O in the low reflective layer 15 is between 80 and 98.9 at %. The total content of Ta and O in the low reflective layer 15 is preferably between 85.5 and 98.5 at %, more preferably between 86 and 97.5 at %.

The composition ratio of Ta and O (Ta:O) in the low reflective layer 15 is between 1:8 and 3:1. When the proportion of Ta is higher than such composition ratio, the ray reflectivity in the wavelength region of a pattern inspection light cannot sufficiently be lowered. On the other hand, when the proportion of O is higher than such composition ratio, the resistance of the film increases whereby a charge-up may take place by irradiating electron beams. Also, the film density decreases and the resistance of the low reflective layer 15 increases whereby a charge-up takes place easily when electron-beam-writing is conducted to the low reflective layer 15. Since the film thickness of the low reflective layer 15 is smaller than the absorbing layer 14, the possibility of causing a charge-up is low. Accordingly, the upper limit of the O content is milder than the absorbing layer 14.

The composition ratio of Ta and O (Ta:O) in the low reflective layer 15 is preferably between 1:7 and 2:1, more preferably between 1:5 and 1:1.

In the EUV mask blank 1 of the present invention, the low reflective layer 15 may contain N in addition to Ta, B, O and H.

In the EUV mask blank 1 of the present invention, according to a second embodiment of the low reflective layer 15, the above-mentioned characteristics can be achieved by incorporating Ta, B, O, H and N at the specified ratio as described hereinbelow.

When the low reflective layer 15 contains N, it can be considered that the smoothness of the surface of low reflective layer 15 is improved.

In this description, the first embodiment and the second embodiment on the low reflective layer are discriminated by describing as the low reflective layer (TaBOH) for the first embodiment and the low reflective layer (TaBONH) for the second embodiment. The material TaOH for the low reflective layer has an insulation property. However, the low reflective layer is usually thin in its film thickness, and accordingly, the problem of charge-up in the electron-beam-writing hardly takes place.

It is preferred that when the low reflective layer is made of a TaBONH film, the B content of the low reflective layer is 1 at % or greater but less than 5 at %. When the B content of the low reflective layer is less than 1 at %, it is necessary to increase a dose of H in order that the crystalline state of the low reflective layer 15 is amorphous, specifically, the H content should be greater than 15 at %. This measure, however, may increase the total film thickness of absorbing layer 14 and low reflective layer 15 which is necessary to control the EUV ray reflectivity to be 0.5% or lower, which depends also on the content of H and the film thickness of the absorbing layer 14, therefore it is undesirable. When the B content of the low reflective layer 15 is 5 at % or greater, the same problem as described on the absorbing layer 14, such as low film deposition rate, takes place easily. The B content of the low reflective layer (TaBONH) is preferably between 1 and 4.5 at %, more preferably between 2 and 4.0 at %.

The H content of the low reflective layer (TaBONH) is between 0.1 and 15 at %. When the H content of the low reflective layer (TaBONH) is less than 0.1 at %, the low reflective layer (TaBONH) is not, in its crystalline state, amorphous. H is a material having a low absorbing coefficient to EUV light. Accordingly, when the H content of the low reflective layer 15 is greater than 15 at %, the total film thickness of absorbing layer 14 and low reflective layer 15 which is necessary to control the EUV ray reflectivity to be 0.5% or less, which depends also on the H content and the film thickness of the absorbing layer 14, is possibly large, therefore it is not desirable.

It is preferred that the H content of the low reflective layer (TaBONH) is between 0.5 and 10 at %, more preferably between 1 and 10 at %.

The remainder excluding B and H in the low reflective layer (TaBONH) is preferably Ta, O and N. Specifically, the total content of Ta, O and N in the low reflective layer 15 is between 80 and 98.9 at %. It is preferred that the total content of Ta, O and N in the low reflective layer 15 is between 85.5 and 98.5 at %, and more preferably it is between 86 and 97.5 at %.

The composition ratio of Ta to O and N (Ta:(O+N)) in the low reflective layer (TaBONH) is between 1:8 and 3:1. When the proportion of Ta is higher than such composition ratio, it is difficult to lower sufficiently the ray reflectivity in the wavelength region of a pattern inspection light. On the other hand, the proportion of O and N is higher than such composition ratio, the oxidation resistance of the low reflective layer (TaBONH) decreases and the resistance of the low reflective layer (TaBONH) increases so that there may take place a problem of charge-up when electron-beam-writing is conducted to the low reflective layer (TaBONH).

It is preferred that the composition ratio of Ta to O and N (Ta:(O+N)) in the low reflective layer (TaBONH) is between 2:7 and 1:1, and is more preferably that it is between 1:3 and 1:1.

A combination of the low reflective layer (TaBONH) and the absorbing layer (TaBNH) is preferred from the viewpoint of easiness in film deposition.

The low reflective layer (TaBOH) is composed of a film which contains at least Ta, B, O and H, and accordingly, the film may contain another element other than these elements.

Further, the low reflective layer (TaBONH) is composed of a film which contains at least Ta, B, O, N and H, and accordingly, the film may contain another element other than these elements. However, in order to achieve an intended low reflection performance with respect to the wavelength region of inspection light for the mask pattern, it is preferred that the content of another element is 2 at % or less and is especially preferable to be 1 at % or less.

As is clear from the above-mentioned points, it is preferred that the low reflective layer in the present invention contains Ta, B, O and H as essential components, and contains N as an arbitrary component; the B content is 1 at % or greater but less than 5 at %; the H content is between 0.1 at % and 15 at %; the total content of Ta and O (when N is contained, O+N) is between 80 and 98.9 at % and the composition ratio (Ta:O) (when N is contained, O+N) is between 1:8 and 3:1.

Since the low reflective layers (TaBOH), (TaBONH) have the constitutions as described above, each crystalline state is amorphous and these surfaces have excellent smoothness. Specifically, the surface roughness of each surface of the low reflective layers (TaBOH), (TaBONH) is 0.5 nm rms or less.

As described before, in order to avoid deterioration in the dimensional accuracy of pattern which is caused by the edge roughness, the surface of the absorbing layer should be smooth. Since the low reflective layer (TaBOH) or (TaBONH) is formed on the absorbing layer, it has preferably a smooth surface from the same reason.

When the surface roughness of the surface of the low reflective layer (TaBOH) or (TaBONH) is 0.5 nm rms or less, the surface of the low reflective layer (TaBOH) or (TaBONH) has a sufficient smoothness, so that deterioration in the dimensional accuracy of pattern caused by the edge roughness hardly takes place. The surface roughness of the low reflective layer 15 is preferably 0.4 nm rms or less, more preferably 0.3 nm rms or less.

When the low reflective layer contains N, it increases smoothness. Accordingly, the low reflective layer (TaBONH) is better than the low reflective layer (TaBOH) in smoothness.

The crystalline state of the low reflective layer (TaBOH) or (TaBONH) being amorphous, i.e., they have an amorphous structure or a microcrystalline structure, can be verified by an X-ray diffraction (XRD) method. When the crystalline state of the low reflective layer (TaBOH) or (TaBONH) is an amorphous structure or a microcrystalline structure, a sharp peak is not found in the diffraction peaks obtained by the XRD measurement.

When the low reflective layer (TaBOH) or (TaBONH) is formed on the absorbing layer, it is preferred that the total film thickness of the absorbing layer and the low reflective layer (TaBOH) or (TaBONH) is between 55 and 130 nm. When the film thickness of the low reflective layer (TaBOH) or (TaBONH) is greater than the film thickness of the absorbing layer, there is a possibility that the absorbing performance of EUV light in the absorbing layer decreases, and accordingly, the film thickness of the low reflective layer (TaBOH) or (TaBONH) should be smaller than the film thickness of the absorbing layer. Therefore, it is preferred that the thickness of the low reflective layer (TaBOH) or (TaBONH) is between 5 and 30 nm, more preferably between 10 and 20 nm.

The low reflective layers (TaBOH), (TaBONH) can be formed by a known film deposition method, e.g., a sputtering method such as a magnetron sputtering method, an ion beam sputtering method. When the magnetron sputtering method is employed, the low reflective layer (TaBOH) can be formed by the method (1) or (2) described below.

(1) The low reflective layer (TaBOH) is formed by using a Ta target and a B target, and by causing simultaneously electric discharges of these targets in the atmosphere of an inert gas which contains oxygen (O), hydrogen (H) and at least one of helium (H), argon (Ar), neon (Ne), krypton (Kr) and xenon (Xe).

(2) The low reflective layer (TaBOH) is formed by using a TaB compound target and by causing the electric discharge of it in the atmosphere of an inert gas containing oxygen (O), hydrogen (H) and at least one of helium (He), argon (Ar), neon (Ne), krypton (Kr) and xenon (Xe).

In these methods, the method (1) which causes simultaneous electric discharges to two or more targets is capable of adjusting the power applied to each target whereby the composition of the low reflective layer (TaBOH) to be formed, can be controlled.

In the above-methods, the method (2) is preferred because an unstable electric discharge and variability in the film composition or the film thickness can be avoided. It is especially preferred that the composition of the TaB compound target is Ta=80 to 99 at % and B=1 to 20 at % because an unstable electric discharge and variability in the film composition and the film thickness can be avoided.

When the low reflective layer (TaBONH) is formed, the same procedure as described above is carried out in the atmosphere of an inert gas which contains oxygen (O), nitrogen (N), hydrogen (H) and at least one of helium (He), argon (Ar), neon (Ne), krypton (Kr) and xenon (Xe).

In order to form the low reflective layer (TaBOH) according to the above-mentioned method, the method may be conducted under the following film deposition conditions.

Method Using a TaB Compound Target (2)

Sputtering gas: A gas mixture of Ar, $O_2$ and $H_2$ (an $H_2$ gas concentration of 1 to 50 vol %, preferably 1 to 30 vol %; an $O_2$ gas concentration of 1 to 80 vol %, preferably 5 to 75 vol %; an Ar gas concentration of 5 to 95 vol %, preferably 10 to 94 vol %; a gas pressure of $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Applied power: 30 to 1,000 W, preferably 50 to 750 W, more preferably 80 to 500 W Film deposition rate: 0.01 to 60 nm/min, preferably 0.05 to 45 nm/min, more preferably 0.1 to 30 nm/min In order to form the low reflective layer (TaBONH) according to the above-mentioned method, the method may be conducted specifically under the following film deposition conditions.

Method Using a TaB Compound Target (2)

Sputtering gas: A gas mixture of Ar, $O_2$, $N_2$, and $H_2$ (an $H_2$ gas concentration of 1 to 50 vol %, preferably 1 to 30 vol %; an $O_2$ gas concentration of 1 to 80 vol %, preferably 5 to 75 vol %; a $N_2$ gas concentration of 1 to 80 vol %, preferably 5 to 75 vol %; an Ar gas concentration of 5 to 95 vol %, preferably 10 to 89 vol %; a gas pressure of $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Applied power: 30 to 1,000 W, preferably 50 to 750 W, more preferably 80 to 500 W Film deposition rate: 0.5 to 60 nm/min, preferably 1.0 to 45 nm/min, more preferably 1.5 to 30 nm/min The reason why it is preferred that the low reflective layer 15 is formed on the absorbing layer 14 in the EUV mask blank 1 of the present invention is that the wavelength of a pattern inspection light is different from the wavelength of EUV light. Accordingly, when EUV light (about 13.5 nm) is employed as the pattern inspection light, it is considered to be unnecessary to form the low reflective layer 15 on the absorbing layer 14. There is a demand for minimizing pattern size, with the result that the wavelength of inspection light is shifted toward a shorter wavelength side, and it is considered that in future it is expected to be 193 nm, and then, 13.5 nm. When the wavelength of inspection light is 13.5 nm, it will be unnecessary to form the low reflective layer 15 on the absorbing layer 14.

The EUV mask blank 1 of the present invention may have a functional film which is already known in the field of EUV mask blank, in addition to the reflective layer 12, the protection layer 13, the absorbing layer 14 and the low reflective layer 15. As a concrete example of such functional film, there is, for example, a high dielectric coating to be applied to the back surface of the substrate, which provides a static chuck for the substrate, as described in JP-A-2003-501823. Here, the back surface of the substrate indicates the surface which is opposite the surface where the reflective layer 12 is formed, in the substrate 11 shown in FIG. 1. In a material constituting the high dielectric coating applied to the back surface of the substrate to perform such object, the electric conductivity and the film thickness are determined so that the sheet resistance be 100 Ω/square or less. The constituting material of the high dielectric coating can widely be selected from those described in known documents. For example, the high dielectric coating described in JP-A-2003-501823, specifically, a coating of silicon, TiN, molybdenum, chrom or TaSi can be employed. The thickness of the high dielectric coating can, for example, be 10 to 1,000 nm.

The high dielectric coating can be formed according a known film forming method such as sputtering method, e.g. magnetron sputtering method, ion beam sputtering method, CVD method, vacuum deposition method or electrolytic plating.

The EUV mask can be produced by patterning at least the absorbing layer of the mask blank of the present invention. The patterning method for the absorbing layer is not in particular limited. For example, a method of applying a resist on the absorbing layer to form a resist pattern and by etching the absorbing layer through the resist pattern as a mask, can be employed. The material for the resist and the writing of a resist pattern may be selected appropriately in consideration of the material for the absorbing layer and so on. The etching method for the absorbing layer is not in particular limited and dry etching such as reactive ion etching or wet etching may be employed. After patterning is conducted to the absorbing layer, the resist is removed by a removing liquid whereby an EUV mask can be obtained.

Description will be made as to a method for producing a semiconductor integrated circuit by using the EUV mask of the present invention. The present invention can be applied to the method for producing a semiconductor integrated circuit according to a photolithography method using EUV light as a light source for exposure. Specifically, a substrate such as silicon wafer or the like on which a resist is applied, is placed on the stage and the EUV mask is set in a reflective exposure device which is constructed by combining a reflecting mirror. Then, the EUV light is irradiated from the light source to the EUV mask via the reflecting mirror, so that the EUV light is reflected by the EUV mask to be irradiated to the substrate on which the resist is applied. By such pattern transcription process, a circuit pattern is transcribed on the substrate. The substrate transcribed with the circuit pattern is subjected to development to etch a photosensitive portion or a non-photosensitive portion, and then the resist is removed. By repeating such process, a semiconductor integrated circuit is produced.

EXAMPLES

In the following, the present invention will be described with Examples, however, the present invention should not be limited to these Examples.

Example 1

In this Example, the EUV mask blank 1 shown in FIG. 1 was prepared. However, in the EUV mask blank 1 in Example 1, the low reflective layer 15 was not formed on the absorbing layer 14. As the substrate 11 for film-depositing, a $SiO_2$—$TiO_2$ type glass substrate (an outer contour of 6 inches (152.4 mm) square and a thickness of 6.3 mm) was used. This glass substrate has a thermal expansion coefficient of $0.2 \times 10^{-7}/°C.$, a Young's modulus of 67 GPa, a Poisson's ratio of 0.17 and a specific rigidity of $3.07 \times 10^7 \text{ m}^2/\text{s}^2$. This glass substrate was polished to form a smooth surface of 0.15 nm rms or less and a flatness of 100 nm or less.

A high dielectric coating having a sheet resistance of 100 Ω/square was applied to the back surface of the substrate 11 by depositing a Cr film having a thickness of 100 nm by using a magnetron sputtering method.

The substrate 11 (an outer contour of 6 inches (152.4 mm) square and a thickness of 6.3 mm) was fixed to an ordinary static chuck having a flat plate shape, by utilizing the formed Cr film. By repeating 40 cycles of alternating film deposition of Si film and Mo film on the front surface of the substrate 11 by using an ion beam sputtering, a Si/Mo multilayered reflective film (reflective layer 12) having the total film thickness of 272 nm ((4.5 nm+2.3 nm)×40) was formed.

On the Si/Mo multilayered reflective film (the reflective layer 12), a Ru film (a film thickness of 2.5 nm) was deposited by using the ion beam sputtering to form a protection layer 13. The conditions of depositing Si film, Mo film and Ru film are as follows.

Conditions of Depositing Si Film
  Target: Si target (boron-doped)
  Sputtering gas: Ar gas (gas pressure: 0.02 Pa)
  Voltage: 700 V
  Film deposition rate: 0.077 nm/sec
  Film thickness: 4.5 nm
Conditions of Depositing Mo Film
  Target: Mo target
  Sputtering gas: Ar gas (gas pressure: 0.02 Pa)
  Voltage: 700 V
  Film deposition rate: 0.064 nm/sec
  Film thickness: 2.3 nm
Conditions of Depositing Ru Film
  Target: Ru target
  Sputtering gas: Ar gas (gas pressure: 0.02 Pa)
  Voltage: 500 V
  Film deposition rate: 0.023 nm/sec
  Film thickness: 2.5 nm Then, on the protection layer 13, a TaBNH layer was formed as the absorbing layer 14 by a magnetron sputtering method, to thereby form an EUV mask blank 1 having the substrate 11 on which the reflective layer 12, the protection layer 13 and the absorbing layer 14 were formed in this order.

The conditions of depositing the TaBNH layer are as follows.
Conditions of Depositing TaBNH Layer
  Target: TaB compound target (composition ratio: Ta 80 at %, B 20 at %)

Sputtering gas: a gas mixture of Ar, $N_2$ and $H_2$ (Ar: 89 vol %, $N_2$: 8.3 vol %, $H_2$: 2.7 vol %, gas pressure: 0.46 Pa)

Applied power: 300 W

Film deposition rate: 1.5 nm/min

Film thickness: 60 nm

The following evaluations (1) to (5) were conducted to the absorbing layer of EUV mask blank obtained according to the above-mentioned procedure.

(1) Film Composition

The composition of the absorbing layer (TaBNH film) was measured with an X-ray photoelectron spectrometer (manufactured by PERKIN ELEMER-PHI: No. 5500). The composition ratio of the absorbing layer (at %) is Ta:B:N:H=60:3:33:4 (Ta content: 60 at %, B content: 3 at %, N content: 33 at %, H content: 4 at %)

(2) Crystalline Structure

The crystalline structure of the absorbing layer (TaBNH film) was verified with an X-ray diffractometer (manufactured by Rigaku Corporation). It was verified that the crystalline structure of the absorbing layer was amorphous or microcrystalline because no sharp peak was not found in the obtained diffraction peaks.

(3) Surface Roughness

According to JIS-B0601 (1994), the surface roughness of the absorbing layer (TaBNH film) was verified with an atomic force microscope (manufactured by Seiko Instruments Inc.: No. SPI3800). The surface roughness of the absorbing layer was 0.15 nm rms.

(4) Resistance

The resistance of the absorbing layer (TaBNH film) was measured with a four probemeter (manufactured by Mitsubishi Petrochemical Co., Ltd.: Loresta AP MCP-T400) to find $2.0 \times 10^{-4}$ Ω·cm.

(5) Etching Characteristics

With respect to etching characteristics, evaluation was made by the following method instead of evaluating the EUV mask blank prepared according to the above-mentioned procedure. On the specimen table (a quartz substrate of 4 inches) of an RF plasma etching device, Si chips (10 mm×30 mm) were placed as specimens wherein a Ru film was deposited on a Si chip and a TaBNH film was deposited on the other, these films being deposited by the methods described below. In this state, an RF plasma etching was conducted to the Ru film and the TaBNH film on the respective Si chips placed on the specimen table under conditions as follows.

Bias RF: 50 W

Etching time: 120 sec

Trigger pressure: 3 Pa

Etching pressure: 1 Pa

Etching gas: $Cl_2$/Ar

Gas flow rate ($Cl_2$/Ar): 20/80 sccm

Distance between electrode substrates: 55 mm

The Ru film was formed by an ion beam sputtering method under the film deposition conditions as follows.

Conditions of Depositing Ru Film

Target: Ru target

Sputtering gas: Ar gas (gas pressure: 2 mTorr, flow rate: 15 sccm)

Power: 150 W

Film deposition rate: 0.023 nm/sec

Film thickness: 2.5 nm

The TaBNH film was formed under the same conditions as Example 1 except that a Si substrate was employed as the substrate. Etching rates were obtained from those of the Ru film and the TaBNH film which were deposit under the above-mentioned conditions, and an etching selection ratio was obtained by using the following formula.

Etching selection ratio=(etching rate of TaBNH film)/(etching rate of Ru film)

It is desirable that the etching selection ratio with the protection layer 13 is 10 or greater. The etching selection ratio of the TaBNH film is described below. Either film showed a sufficient selection ratio.

TaBNH film: 13.9

Example 2

In this Example, an EUV mask blank 1 in which a low reflective layer 15 was formed on the absorbing layer 14, was prepared.

This Example was conducted in the same manner as Example 1 until the absorbing layer 14 was formed on the protection layer 13. And, on the absorbing layer 14, a TaBONH film was deposited by a magnetron sputtering method to form the low reflective layer 15 with respect to inspection light having a wavelength of 257 nm. The composition ratio (at %) of the low reflective layer was measured in the same manner as Example 1 to find Ta:B:N:O:H=25:3:5:59:8.

The conditions of depositing the TaBONH film are as follows.

Conditions of Depositing TaBONH Layer

Target: TaB target (composition ratio: Ta 80 at %, B 20 at %)

Sputtering gas: a gas mixture of Ar, $N_2$, $O_2$ and $H_2$ (Ar: 60 vol %, $N_2$: 17.3 vol %, $O_2$: 20 vol %, $N_2$: 2.7 vol %, gas pressure: 0.3 Pa)

Applied power: 450 W

Film deposition rate: 1.5 nm/sec

Film thickness: 10 nm

The following evaluation (6) was carried out to the low reflective layer of the EUV mask blank obtained according to the above-mentioned procedure.

(6) Reflection Characteristics (Evaluation of Contrast)

At the stage that the protection layer (Ru layer) 13 was formed in Example 1, the reflectivity of a pattern inspection light (wavelength of 257 nm) at the surface of the protection layer 13 was measured with a spectrophotometer. Further, after the low reflective layer (TaBONH) 15 in Example 2 was formed, the reflectivity of the pattern inspection light at the surface of the low reflective layer was measured. As a result, the reflectivity at the surface of the protection layer 13 was 60.0%, and the reflectivity at the surface of the low reflective layer 15 was 6.9%. With this result and the above-mentioned formula, the contrast was obtained. It showed 79.4%.

With the EUV mask blank 1 obtained, the reflectivity of EUV light was measured by irradiating the EUV light (wavelength: 13.5 nm) to the surface of the low reflective layer 15. As a result, the reflectivity of the EUV light was 0.4%. It was confirmed that the mask blank had excellent EUV absorption characteristics.

Example 3

This Example was carried out in the same procedure as Example 2 except that the low reflective layer 15 formed on the absorbing layer 14 was composed of TaBOH.

The low reflective layer 15 (TaBOH) was deposited by using a magnetron sputtering method. The composition ratio (at %) of the low reflective layer 15 was measured by the same method as in Example 1 to find Ta:B:O:H=29:4:59:8.

The conditions of depositing the TaBOH film are as follows.

Conditions of Depositing TaBOH Layer

Target: TaB target (composition ratio: Ta 80 at %, B 20 at %)

Sputtering gas: a gas mixture of Ar, $O_2$ and $H_2$ (Ar: 60 vol %, $O_2$: 37.3 vol %, $H_2$: 2.7 vol %, gas pressure: 0.3 Pa)

Applied power: 450 W

Film deposition rate: 2.0 nm/sec

Film thickness: 10 nm

With the low reflective layer of the EUV mask blank obtained according to the above-mentioned procedure, the reflection characteristics were evaluated in the same manner as Example 2. The reflectivity of a pattern inspection light (257 nm) at the surface of the low reflective layer 15 was 6.0%. With these results and the above-mentioned formula, the contrast was obtained and it was 81.8%.

With the EUV mask blank 1 obtained, the reflectivity of EUV light was measured by irradiating the EUV light (wavelength: 13.5 nm) at the surface of the low reflective layer 15. As a result, the reflectivity of the EUV light was 0.5%. It was confirmed that it had excellent EUV absorption characteristics.

Comparative Example 1

Comparative Example 1 was carried out in the same procedure as Example 1 except that the absorbing layer of a tantalum.boron alloy nitride film (TaBN) but not containing hydrogen (H). Such TaBN film was deposited by using a TaB target (Ta:B=80 at %:20 at %) under the conditions as follows.

Conditions of Depositing TaBN Layer

Target: TaB target (composition ratio: Ta 80 at %, B 20 at %)

Sputtering gas: Ar gas, $N_2$ gas (Ar: 86 vol %, $N_2$: 14 vol %, gas pressure: 0.3 Pa)

Applied power: 150 W

Film deposition rate: 6.4 nm/sec

Film thickness: 60 nm

The composition (at %) of the obtained TaBN film was measured with an X-ray photoelectron spectrometer to find Ta:B:N=50:4:46.

When the crystalline structure of the obtained TaBN film was verified with an X-ray diffractometer, it was confirmed that the TaBN layer is crystalline because a sharp peak was found in the obtained diffraction peaks. The surface roughness of the TaBN film was verified with an atomic force microscope. It was 0.5 nm rms which is greater than that of the absorbing layer (TaBNH layer) in Example 1.

The optimization of the film depositing conditions was conducted by using the above-mentioned TaB target. In any case, the B content was less than 5 at % and any TaBN film of amorphous structure was not obtained.

Comparative Example 2

Comparative Example 2 was carried out in the same procedure as Example 1 except that the absorbing layer was of a tantalum boron alloy nitride film (TaBN) but not containing hydrogen (H). Such TaBN film was deposited by using a TaB target (Ta:B=50 at %:50 at %) under the conditions as follows.

Conditions of Depositing TaBN Layer

Target: TaB target (composition ratio: Ta 50 at %, B 50 at %)

Sputtering gas: Ar gas, $N_2$ gas (Ar: 86 vol %, $N_2$: 14 vol %, gas pressure: 0.3 Pa)

Applied power: 150 W

Film deposition rate: 4.0 nm/sec

Film thickness: 60 nm

When the composition (at %) of the obtained TaBN film was measured with an X-ray photoelectron spectrometer, it was found that the B content was 5 at % or greater.

The crystalline structure of the formed TaBN film was verified with an X-ray diffractometer. It was verified that the crystalline structure of the absorbing layer had an amorphous structure or a microcrystalline structure because no sharp peak was not found in the obtained diffraction peaks.

The surface roughness of the deposited TaBN film was verified with an atomic force microscope to find 0.2 nm rms.

Further, in the same procedure as Example 1, the reflectivity of the pattern inspection light (wavelength: 257 nm) at each surface of the protection layer (Ru layer) 13 and TaBN layer was measured. As a result, the reflectivity at the surface of the protection layer 13 was 60.0% and the reflectivity at the surface of the TaBN layer was 9.9%. With these results and the above-mentioned formula, the contrast was obtained. It was 71.7% which was lower than that of Example 1.

The etching characteristics of the TaBN film were evaluated in the same procedure as the above-mentioned. As a result, the etching selection ratio of the TaBN film was 12.8.

The film deposition rate of TaBN layer in Comparative Example 2 was about ⅔ of that of Example 1, which was fairly slow. Tests for confirming the reproducibility were conducted several times under the same conditions as Comparative Example 2. As a result, it was confirmed that the electric discharge was unstable, there was sometimes incapable of film deposition or it was very difficult to control the film composition and the film thickness.

Comparative Example 3

Comparative Example 3 is carried out in the same procedure as Example 1 except that the B concentration in the TaBNH layer is less than 1 at %.

In the confirmation of the crystalline structure of an obtainable TaBNH layer with an X-ray diffractometer, it is confirmed that the TaBNH layer is crystalline because a sharp peak is found in the obtained diffraction peaks.

Comparative Example 4

Comparative Example 4 is carried out in the same procedure as Example 1 except that the B content in the TaBNH layer is greater than 5 at %.

In Comparative Example 4, the film deposition rate of the TaBNH layer is extremely lower than Example 1. Tests for confirming the reproducibility are carried out several times under the conditions of Comparative Example 4. It is confirmed that the electric discharge is unstable and there is sometimes impossible to deposit the film or it is fairly difficult to control the film composition and the film thickness.

Comparative Example 5

Comparative Example 5 is carried out in the same procedure as Example 1 except that the H content in the TaBNH layer is less than 0.1 at %.

In the confirmation of the crystalline structure of the obtainable TaBNH layer with an X-ray diffractometer, it is confirmed that the TaBNH layer is crystalline because a sharp peak is found in the obtained diffraction peaks.

Comparative Example 6

Comparative Example 6 is carried out in the same procedure as Example 1 except that the H content in the TaBNH layer is greater than 5 at %.

In the measurement of the reflectivity of EUV light at the surface of the obtained TaBNH layer, it is 0.8% and it is confirmed that the EUV light absorption characteristics are lower than those of the absorbing layer in Example 1.

INDUSTRIAL APPLICABILITY

The mask blank of the present invention can be utilized for producing a semiconductor integrated circuit by a photolithography method with EUV light as an light exposure source.

The entire disclosure of Japanese Patent Application No. 2008-279859 filed on Oct. 30, 2008 including specification, claims, drawings and summary is incorporated herein by reference in its entirety.

REFERENCE SYMBOLS

1: EUV mask blank
11: Substrate
12: Reflective layer (multilayered reflective film)
13: Protection layer
14: Absorbing layer
15: Low reflective layer

What is claimed is:

1. A reflective mask blank for EUV lithography having a reflective layer for reflecting EUV light and an absorbing layer for absorbing EUV light which are formed in this order on a substrate,
   the reflective mask blank for EUV lithography being characterized in that the absorbing layer contains at least tantalum (Ta), boron (B), nitrogen (N) and hydrogen (H), and
   the absorbing layer has a B content that is 1 at % or greater but less than 5 at %, an H content that is between 0.1 and 5 at %, a Ta+N total content that is between 90 and 98.9 at %, and a Ta:N composition ratio (Ta:N) that is between 8:1 and 1:1.

2. The reflective mask blank for EUV lithography described in claim 1, wherein the surface roughness of the absorbing layer is 0.5 nm rms or less.

3. The reflective mask blank for EUV lithography described in claim 1, wherein the film thickness of the absorbing layer is between 30 and 100 nm.

4. The reflective mask blank for EUV lithography described in claim 1, wherein a low reflective layer with respect to inspection light which is used for inspecting a mask pattern, is formed on the absorbing layer,
   the low reflective layer contains at least tantalum (Ta), boron (B), oxygen (O) and hydrogen (H), and
   the low reflective layer has a B content that is 1 at % or greater but less than 5 at %, an H content that is between 0.1 and 15 at %, a Ta+O total content that is between 80 and 98.9 at %, and a Ta:O composition ratio (Ta:O) that is between 1:8 and 3:1.

5. The reflective mask blank for EUV lithography described in claim 4, wherein the low reflective layer is formed by sputtering a TaB compound target in the atmosphere containing oxygen (O), hydrogen (H) and an inert gas containing at least one of helium (He), argon (Ar), neon (Ne), krypton (Kr) and xenon (Xe).

6. The reflective mask blank for EUV lithography described in claim 5, wherein the TaB compound target is composed of Ta=80 to 99 at % and B=1 to 20 at %.

7. The reflective mask blank for EUV lithography described in claim 1, wherein a low reflective layer with respect to inspection light which is used for inspecting a mask pattern, is formed on the absorbing layer,
   the low reflective layer contains at least tantalum (Ta), boron (B), oxygen (O), nitrogen (N) and hydrogen (H), and
   the low reflective layer has a B content that is 1 at % or greater but less than 5 at %, an H content that is between 0.1 and 15 at %, a Ta+O+N total content that is between 80 and 98.9 at % and a Ta:O+N composition ratio (Ta:(O+N)) that is between 1:8 and 3:1.

8. The reflective mask blank for EUV lithography described in claim 7, wherein the low reflective layer is formed by sputtering a TaB compound target in the atmosphere containing oxygen (O), nitrogen (N), hydrogen (H) and an inert gas containing at least one of helium (He), argon (Ar), neon (Ne), krypton (Kr) and xenon (Xe).

9. The reflective mask blank for EUV lithography described in claim 1, wherein the absorbing layer is formed by sputtering a TaB compound target in the atmosphere containing nitrogen (N), hydrogen (H) and an inert gas containing at least one of helium (He), argon (Ar), neon (Ne), krypton (Kr) and xenon (Xe).

10. The reflective mask blank for EUV lithography described in claim 9, wherein the TaB compound target is composed of Ta=80 to 99 at % and B=1 to 20 at %.

11. A reflective mask blank for EUV lithography having a reflective layer for reflecting EUV light and an absorbing layer for absorbing EUV light which are formed in this order on a substrate,
    the reflective mask blank for EUV lithography being characterized in that the absorbing layer contains at least tantalum (Ta), boron (B), nitrogen (N) and hydrogen (H), and
    the absorbing layer is, in its crystalline state, amorphous.

12. The reflective mask blank for EUV lithography described in claim 11, wherein the surface roughness of the absorbing layer is 0.5 nm rms or less.

13. The reflective mask blank for EUV lithography described in claim 11, wherein the film thickness of the absorbing layer is between 30 and 100 nm.

14. The reflective mask blank for EUV lithography described in claim 11, wherein a low reflective layer with respect to inspection light which is used for inspecting a mask pattern, is formed on the absorbing layer,
    the low reflective layer contains at least tantalum (Ta), boron (B), oxygen (O) and hydrogen (H), and
    the low reflective layer has a B content that is 1 at % or greater but less than 5 at %, an H content that is between 0.1 and 15 at %, a Ta+O total content that is between 80 and 98.9 at %, and a Ta:O composition ratio (Ta:O) that is between 1:8 and 3:1.

15. The reflective mask blank for EUV lithography described in claim 11, wherein a low reflective layer with respect to inspection light which is used for inspecting a mask pattern, is formed on the absorbing layer,
    the low reflective layer contains at least tantalum (Ta), boron (B), oxygen (O), nitrogen (N) and hydrogen (H), and the low reflective layer has a B content that is 1 at % or greater but less than 5 at %, an H content that is between 0.1 and 15 at %, a Ta+O+N total content that is between 80 and 98.9 at % and a Ta:O+N composition ratio (Ta:(O+N)) that is between 1:8 and 3:1.

16. The reflective mask blank for EUV lithography described in claim 11, wherein the absorbing layer is formed by sputtering a TaB compound target in the atmosphere containing nitrogen (N), hydrogen (H) and an inert gas containing at least one of helium (He), argon (Ar), neon (Ne), krypton (Kr) and xenon (Xe).

17. The reflective mask blank for EUV lithography described in claim 16, wherein the TaB compound target is composed of Ta=80 to 99 at % and B=1 to 20 at %.

18. The reflective mask blank for EUV lithography described in claim 11, wherein the low reflective layer is formed by sputtering a TaB compound target in the atmosphere containing oxygen (O), hydrogen (H) and an inert gas containing at least one of helium (He), argon (Ar), neon (Ne), krypton (Kr) and xenon (Xe).

19. A reflective mask blank for EUV lithography having a reflective layer for reflecting EUV light, an absorbing layer for absorbing EUV light and a low reflective layer with respect to inspection light which is used for inspecting a mask pattern, which are formed in this order on a substrate the reflective mask blank for lithography being characterized in that,
the low reflective layer contains at least tantalum (Ta), boron (B), oxygen (O) and hydrogen (H), and
the low reflective layer has a B content that is 1 at % or greater but less than 5 at %, an H content that is between 0.1 and 15 at %, a Ta+O total content that is between 80 and 98.9 at %, and a Ta:O composition ratio (Ta:O) that is between 1:8 and 3:1.

20. The reflective mask blank for EUV lithography described in claim 19, wherein the surface roughness of the low reflective layer is 0.5 nm rms or less.

21. The reflective mask blank for EUV lithography described in claim 19, wherein the film thickness of the low reflective layer is between 5 and 30 nm.

22. The reflective mask blank for EUV lithography described in claim 19, wherein a protection layer for protecting the reflective layer at the time of forming a pattern in the absorbing layer is formed between the reflective layer and the absorbing layer, and
with respect to the wavelength of the light used for inspecting the pattern formed in the absorbing layer, the contrast of the reflective light at the surface of the protection layer with the reflective light at the surface of the low reflective layer, is 30% or greater.

23. The reflective mask blank for EUV lithography described in claim 19, wherein the H concentration of the low reflective layer is at least 1.5 at % higher than the H concentration of the absorbing layer.

24. The reflective mask blank for EUV lithography described in claim 19, wherein with respect to the wavelength of the light used for inspecting a pattern formed in the absorbing layer, the reflectivity at the surface of the low reflective layer is 15% or less.

25. A reflective mask blank for EUV lithography having a reflective layer for reflecting EUV light, an absorbing layer for absorbing EUV light and a low reflective layer with respect to inspection light which is used for inspecting a mask pattern, which are formed in this order on a substrate, the reflective mask blank for lithography being characterized in that
the low reflective layer contains at least tantalum (Ta), boron (B), oxygen (O), nitrogen (N) and hydrogen (H), and
the low reflective layer has a B content that is 1 at % or greater but less than 5 at %, an H content that is between 0.1 and 15 at %, a Ta+O+N total content that is between 80 and 98.9 at % and a Ta:O+N composition ratio (Ta:(O+N)) that is between 1:8 and 3:1.

26. The reflective mask blank for EUV lithography described in claim 25, wherein the low reflective layer is formed by sputtering a TaB compound target in the atmosphere containing oxygen (O), nitrogen (N), hydrogen (H) and an inert gas containing at least one of helium (He), argon (Ar), neon (Ne), krypton (Kr) and xenon (Xe).

27. The reflective mask blank for EUV lithography described in claim 26, wherein the TaB compound target is composed of Ta=80 to 99 at % and B=1 to 20 at %.

28. The reflective mask blank for EUV lithography described in claim 25, wherein the surface roughness of the low reflective layer is 0.5 nm rms or less.

29. The reflective mask blank for EUV lithography described in claim 25, wherein the film thickness of the low reflective layer is between 5 and 30 nm.

30. The reflective mask blank for EUV lithography described in claim 25, wherein a protection layer for protecting the reflective layer at the time of forming a pattern in the absorbing layer is formed between the reflective layer and the absorbing layer, and
with respect to the wavelength of the light used for inspecting the pattern formed in the absorbing layer, the contrast of the reflective light at the surface of the protection layer with the reflective light at the surface of the low reflective layer, is 30% or greater.

31. The reflective mask blank for EUV lithography described in claim 25, wherein the H concentration of the low reflective layer is at least 1.5 at % higher than the H concentration of the absorbing layer.

32. The reflective mask blank for EUV lithography described in claim 25, wherein with respect to the wavelength of the light used for inspecting a pattern formed in the absorbing layer, the reflectivity at the surface of the low reflective layer is 15% or less.

33. A reflective mask for EUV lithography characterized by conducting pattering to the absorbing layer and the low reflective layer of a reflective mask blank for EUV lithography described in claim 1.

34. A reflective mask for EUV lithography characterized by conducting pattering to the absorbing layer and the low reflective layer of a reflective mask blank for EUV lithography described in claim 11.

35. A reflective mask for EUV lithography characterized by conducting pattering to the absorbing layer and the low reflective layer of a reflective mask blank for EUV lithography described in claim 19.

36. A reflective mask for EUV lithography characterized by conducting pattering to the absorbing layer and the low reflective layer of a reflective mask blank for EUV lithography described in claim 25.

37. A method for producing a semiconductor integrated circuit characterized in that the semiconductor integrated circuit is produced by exposing light to an object to be exposed with use of the reflective mask for EUV lithography described in claim 36.

* * * * *